(12) United States Patent
Park

(10) Patent No.: US 7,598,552 B2
(45) Date of Patent: Oct. 6, 2009

(54) IMAGE SENSOR HAVING IMPROVED SENSITIVITY AND METHOD OF MANUFACTURING THE SAME

(75) Inventor: Byung-jun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 11/820,170

(22) Filed: Jun. 18, 2007

(65) Prior Publication Data
US 2008/0036023 A1    Feb. 14, 2008

(30) Foreign Application Priority Data
Aug. 11, 2006    (KR)  .................... 10-2006-0076334

(51) Int. Cl.
*H01L 31/113*    (2006.01)
(52) U.S. Cl. ................. 257/291; 257/292; 257/293; 257/432; 257/444; 257/E27.132; 257/E27.133
(58) Field of Classification Search ................. 257/291, 257/292, 293, 432, 444, E27.132, E27.133
See application file for complete search history.

(56) References Cited

U.S. PATENT DOCUMENTS

2001/0030703 A1 * 10/2001 Inoue .................. 348/308
2006/0157760 A1 * 7/2006 Hayashi et al. ............. 257/293
2006/0163451 A1   7/2006 Park et al.
2007/0194356 A1 * 8/2007 Moon et al. ................. 257/291

FOREIGN PATENT DOCUMENTS

| JP | 6-120471 | 4/1994 |
| JP | 200150846 A | 5/2000 |
| JP | 2003-282851 | 10/2003 |
| JP | 2005-294749 | 10/2005 |
| KR | 1020060086029 A | 7/2006 |

* cited by examiner

*Primary Examiner*—Long K Tran
(74) *Attorney, Agent, or Firm*—Mills & Onello LLP

(57) ABSTRACT

In an image sensor in which a vertical length from a photoelectric conversion element to an uppermost micro-lens is minimal, and a method of manufacturing the same, the image sensor includes a substrate, a plurality of photoelectric conversion elements, and first to n-level (where n is an integer greater than or equal to 2) metal wires. In the substrate, a sensor region and a peripheral circuit region are defined. The plurality of photoelectric conversion elements are formed in or on the substrate within the sensor region. The first to n-level metal wires are sequentially formed on the substrate. The n-level metal wires within the sensor region are of a thickness that is less than the n-level metal wires within the peripheral circuit region.

12 Claims, 5 Drawing Sheets

IMAGE SENSOR HAVING IMPROVED SENSITIVITY AND METHOD OF MANUFACTURING THE SAME

CROSS-REFERENCE TO RELATED APPLICATION

This application is based on and claims priority to Korean Patent Application No. 10-2006-0076334 filed on Aug. 11, 2006 in the Korean Intellectual Property Office, the disclosure of which is incorporated herein in its entirety by reference.

BACKGROUND OF THE INVENTION

1. Field of the Invention

The present invention relates generally to an image sensor and a method of manufacturing the same, and more particularly to a CMOS image sensor and a method of manufacturing the same.

2. Description of the Related Art

An image sensor converts an optical image to electrical signals. With the continued development of the computer and communication industries, the demand for image sensors has rapidly increased as devices including digital cameras, camcorders, security cameras, and micro-cameras for medical purposes employ image sensors.

A CMOS image sensor offers operation ease, and can be implemented using various scanning methods. Furthermore, signal processing circuits can be integrated into a single chip, thereby enabling a product to be miniaturized, and compatible CMOS processing technology can be used, thereby reducing the manufacturing cost. Power consumption is also low; therefore such sensors can be applied to products where battery capacity is limited.

As described above, the CMOS image sensor is generally manufactured using CMOS processing technology, and aluminum, which is widely used in the CMOS processing, has been used as the metal wires that interconnect the various elements of the CMOS image sensor. However, aluminum wires have a high sheet resistance value, and, therefore, they must be formed to a greater thickness than copper wires to achieve similar performance. Accordingly, the interlayer dielectric in which the aluminum wires are formed must also be thicker relative to a comparable interlayer dielectric in which copper wires are formed using a dual damascene process.

When aluminum interconnecting wires are used as described above, the vertical distance from a photoelectric conversion element, formed in a substrate, to an uppermost micro-lens at a top of the structure is great, so that the optical path along which light photons travel from the an external source to the photoelectric conversion element is likewise great, thereby reducing the sensitivity of the photoelectric conversion element.

In order to address the above problem, research has been conducted on the application of copper wires. However, the use of copper wires carries with it an enormous investment in fabrication equipment.

SUMMARY OF THE INVENTION

Embodiments of the present invention are directed to an image sensor having improved sensitivity, even when employing aluminum interconnecting wires, and a method of manufacturing the same, thereby addressing and overcoming the limitations associated with the conventional approaches.

An object of the embodiments of the present invention is to provide an image sensor in which the vertical length from a photoelectric conversion element to an uppermost micro-lens is relatively reduced, and a method of manufacturing the same.

In one aspect, an image sensor comprises: a substrate in which a sensor region and a peripheral circuit region are defined; a plurality of photoelectric conversion elements formed in or on the substrate within the sensor region; and first to n-level (where n is an integer greater than or equal to 2) metal wires sequentially formed on the substrate; wherein a thickness of the n-level metal wires within the sensor region is less than a thickness of the n-level metal wires within the peripheral circuit region.

In one embodiment, the thickness of the n-level metal wires within the sensor region is within a range of about 1500 to 3000 Å, and the thickness of the n-level metal wires within the peripheral circuit-region is within a range of about 4000 to 6000 Å.

In another embodiment, the n-level metal wires are second level metal wires.

In another embodiment, the n-level metal wires are third level metal wires.

In another embodiment, the n-level metal wires comprise metal or metal alloy including aluminum.

In another embodiment, thicknesses of the first level to n–1-level metal wires within the sensor region are respectively equal to thicknesses of respective first level to n–1-level metal wires within the peripheral circuit region.

In another embodiment, the image sensor further comprises first level to n-level metal interlayer dielectric layers respectively corresponding to first level to n-level metal wires.

In another embodiment, the thickness of the n-level metal interlayer dielectric layer within the sensor region is less than a thickness of the n-level metal interlayer dielectric layer within the peripheral circuit region In another embodiment, the image sensor further comprises a plurality of optical light guides positioned to correspond to the plurality of photoelectric conversion elements, the optical light guides being self-aligned with the n-level metal wires and being formed in the metal interlayer dielectric layer.

In another embodiment, the image sensor further comprises: a plurality of color filters respectively formed on the photoelectric conversion elements; and a plurality of micro-lenses respectively formed on the color filters.

In another aspect, an image sensor comprises: a substrate in which a sensor region, including a main sensor region, a dummy sensor region, and a peripheral circuit region are defined; a plurality of photoelectric conversion elements formed in or on the substrate within the sensor region; a plurality of metal wires formed on the substrate; and a plurality of metal interlayer dielectric layers surrounding the plurality of metal wires; wherein the at least one of the metal wires within the main sensor region is thinner than a corresponding level metal wire within the peripheral circuit region.

In one embodiment, the metal wires within the main sensor region are the uppermost level wires.

In another embodiment, uppermost level metal wires comprise metal or metal alloy including aluminum.

In another embodiment, a thickness of a first portion of the metal wires in a part of the dummy sensor region is less than a thickness of a second portion of the metal wires in a remaining part of the dummy sensor region.

In another embodiment, the first portion of the metal wires is adjacent the main sensor region.

In another aspect, a method of manufacturing an image sensor comprises: preparing a substrate in which a sensor region, including a main sensor region and a dummy sensor region, and a peripheral circuit region, are defined; forming a plurality of photoelectric conversion elements in or on the substrate within the sensor region; forming first level metal wires on the substrate; forming n (where n is an integer greater than or equal to 2) level metal wires on the first level metal wires; forming a first mask that exposes the main sensor region; and partially etching a portion of the n-level metal wires within the main sensor region using the first mask.

In one embodiment, the method comprises: forming a first level metal interlayer dielectric layer surrounding the first level metal wires; and forming an n-level metal interlayer dielectric layer surrounding the n-level metal wires.

In another embodiment, the method further comprises etching the n-level metal interlayer dielectric layer when the n-level metal wires within the main sensor region are etched.

In another embodiment, the method further comprises forming optical light guides by etching the n to first level metal interlayer dielectric layers.

In another embodiment, the n level metal wires comprise metal or metal alloy including aluminum.

In another embodiment, the n level metal wires are second level metal wires.

In another embodiment, the n level metal wires are third level metal wires.

In another embodiment, the method further comprises forming microlenses in the main sensor region.

BRIEF DESCRIPTION OF THE DRAWINGS

The above and other objects, features and advantages of the present invention will be more clearly understood from the following detailed description, taken in conjunction with the accompanying drawings, in which.

DETAILED DESCRIPTION OF EMBODIMENTS

Figure 1:
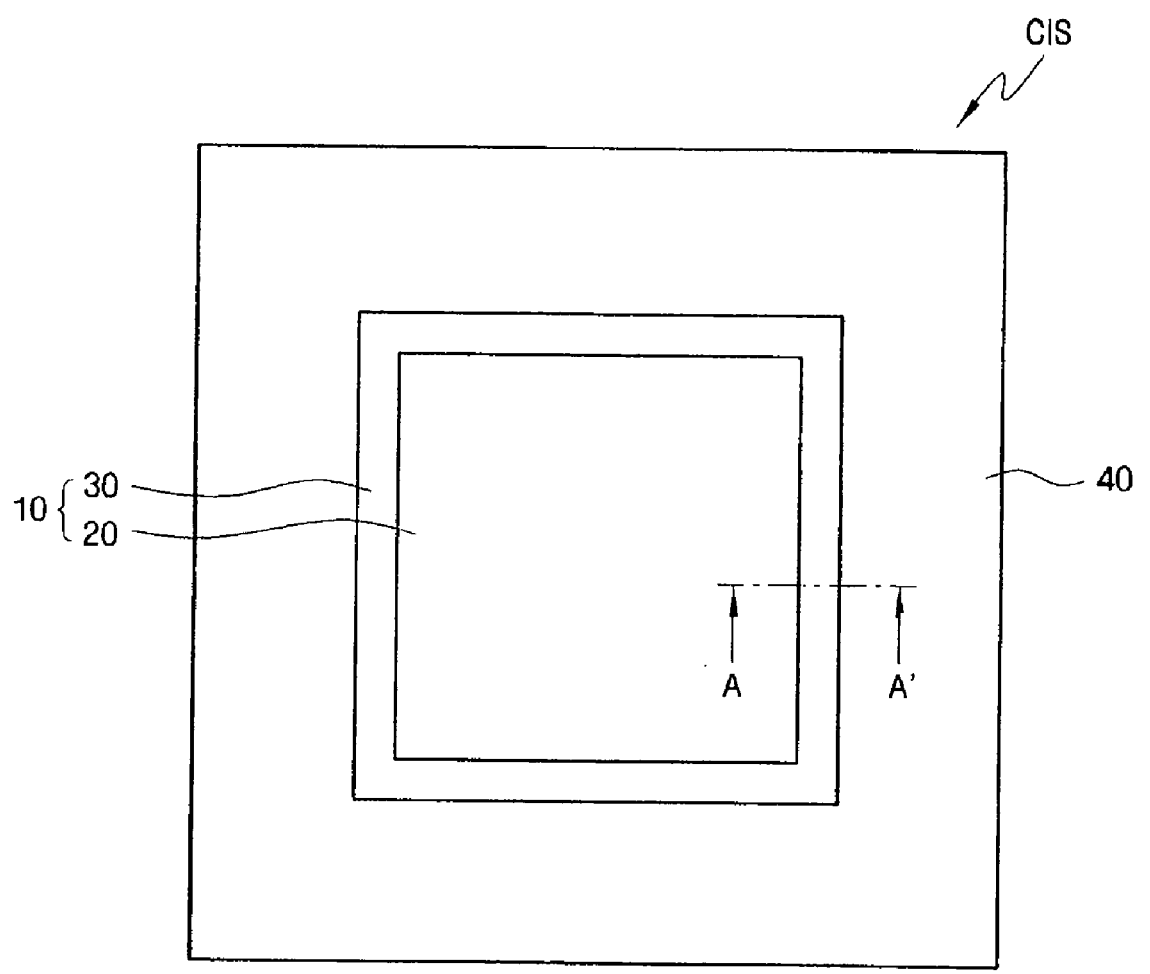
FIG. 1 is a plan view illustrating an image sensor according to an embodiment of the present invention.

Reference now should be made to the drawings, in which the same reference numerals are used throughout the different drawings to designate the same or similar components. Embodiments of the present invention are described in detail below with reference to the accompanying drawings.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 is a plan view illustrating a image sensor CIS according to an embodiment of the present invention. Referring to FIG. 1, the image sensor CIS includes a sensor region 10 including a main sensor region 20, a dummy sensor region 30, and a peripheral circuit region 40 surrounding the sensor region 10.

In the main sensor region 20, unit pixels are arranged in an array having a matrix arrangement. In this case, each unit pixel includes read-out elements each including at least one of a photoelectric conversion element, a transfer transistor, a reset transistor, a select transistor, and a drive transistor. For example, the photoelectric conversion element may comprise a photodiode or a photogate.

In the dummy sensor region 30, unit pixels are arranged in an array having a matrix arrangement, like those of the main sensor region 20. However, the pixels of the dummy sensor region 30 operate as dummy pixels for the photoelectric conversion elements of the main region 20, or as reference pixels, rather than operating to convert external light into electrical signals.

For example, an Optical Black (OB) region operates as a reference for the main photoelectric conversion elements of the main sensor region 20. Furthermore, the dummy sensor region 30 may be a region in which only a dummy pattern exists, or a region that includes the OB region in addition to the dummy pattern.

The peripheral circuit region 40 is a region other than the sensor region 10, and includes analog circuits and digital circuits that support the operation of the device. For example, analog circuits or digital circuits, such as Correlated Double Sampling (CDS), Image Signal Processing (ISP), or Analog to Digital Converter (ADC) circuits, can be formed in the peripheral circuit region 40.

Figure 2:
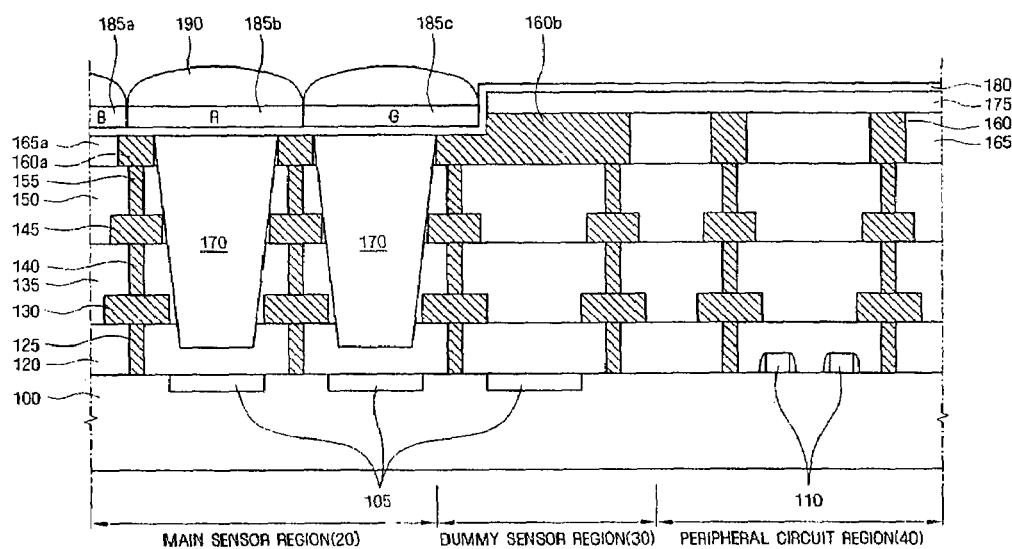
FIG. 2 is a sectional view taken along line A-A' of FIG. 1 illustrating an image sensor according to the embodiment of the present invention.

FIG. 2 is a sectional view taken along line A-A' of FIG. 1, illustrating an image sensor according to the embodiment of the present invention. Referring to FIG. 2, photoelectric conversion elements 105 are formed in a substrate 100, including the main sensor region 20, the dummy sensor region 30, and the peripheral circuit region 40.

Each of the photoelectric conversion elements 105 can be formed, for example, of an N-type photodiode, or a P-type photodiode, which is formed in or on the surface of the substrate 100. In this case, the N-type photodiode generates electrons in proportion to the amount of incident external light incident, and the P-type photodiode eliminates dark current generated due to defects present on the surface of the substrate 100.

A plurality of transistors 110 are formed on the substrate 100 in the peripheral circuit region 40. The transistors 110 within the peripheral circuit region 40 may be N-type or P-type transistors. Furthermore, transistors (not shown) constituting read-out elements are formed in the main sensor region 20 and the dummy sensor region 30. The read-out elements can comprise, for example, transfer transistors, reset transistors or select transistors.

Referring to FIG. 2, an interlayer dielectric 120 is formed on the substrate 100. Furthermore, first contacts 125 which electrically connect metal interconnect wires to the underlying transistors are formed in the interlayer dielectric layer 120. First level metal interconnect wires 130 are formed on the interlayer dielectric layer 120 and the first contact 125. In this case, the first level metal wires 130 may be a metal layers made of aluminum or copper. The first level metal wires 130 may have a thickness within a range of about 1500 to 3000 Å, for example. A first level metal interlayer dielectric layer 135 is formed on the first level metal wires 130.

Second contacts 140 are formed in the first level metal interlayer dielectric layer 135. In this case, the second contacts 140 are contacts that electrically connect upper metal wires to lower metal wires. Referring to FIG. 2, second level metal wires 145 are formed on the second contacts 140 and the first level metal interlayer dielectric layer 135. In this case, the second level metal wires 145 may be metal layers made of aluminum or copper. The second level metal wires 145 may have a thickness within a range of about 1500 to 3000 Å, for example. A second level metal interlayer dielectric layer 150 is formed on the second level metal wires 145. Furthermore, third contacts 155 are formed in the second level metal interlayer dielectric layer 150. Referring to FIG. 2, third level metal wires 160a, 160b and 160 are formed on the third contacts 155 and the second level metal interlayer dielectric layer 150. The third level metal wires 160a, that are in the sensor region, particularly, in the main sensor region 20, are thinner than the third level metal wires 160 that are in the peripheral circuit region 40. For example, the third level metal wires 160 within the peripheral circuit region 40 may have a thickness within a range of 4000 to 6000 Å, and the third level metal wires 160a within the sensor region 20 may have a thickness within a range of 1500 to 3000 Å. In this case, the third level metal wires 160 and 160a may comprise a metal, or metal alloy, including aluminum.

Although, in the present embodiment, the image sensor having the first to third level metal wires has been described, the uppermost level metal wires may be formed on the second level metal wires, or on an n-level (where n is an integer greater than 2) metal wires.

In this embodiment, a portion of the third level metal wire 160b, which is the uppermost level metal wire within the dummy sensor region 130, has the same thickness as the third level metal wires 160a within the main sensor region 20, and the remaining portion thereof has the same thickness as the third level metal wires 160 within the peripheral circuit region 40. The uppermost level metal wire can be used as an optical shield metal within the sensor region 20, or can be a metal wire to which an external voltage VDD is applied.

Third level metal interlayer dielectric layers 165a and 165, providing insulation between the third level metal wires 160a and 160, are formed. The third level metal interlayer dielectric layer 165a within the main sensor region 20 can be formed to have the same thickness as the third level metal wire 160a. The third level metal interlayer dielectric layer 165 within the peripheral circuit region 40 can be formed to have the same thickness as the third level metal wire 160 within the peripheral circuit region 40. In this case, the third level metal interlayer dielectric layer 165 may have the same height as the third level metal wire 160, as shown, or may cover the third level metal wire 160.

Although, in this embodiment, the image sensor having the first level to third level metal interlayer dielectric layers has been described, the uppermost level metal interlayer dielectric layer may be a corresponding one of the second to n-level metal interlayer dielectric layers depending on which of second level to n-level metal wires is the uppermost level metal wire.

Referring to FIG. 2, optical light guides 170 are formed in the interlayer dielectric layer 120 and metal interlayer dielectric layers 135, 150 and 165 on the photoelectric conversion elements 105 within the main sensor region 20.

For example, the optical light guides 170 are formed spaced apart from the photoelectric conversion elements 105 in consideration of the number of metal wires or the optical characteristics of the image sensor. In this embodiment, the optical light guides 170 are formed entirely through the metal interlayer dielectric layers 135, 150 and 165 and partially through part of the metal interlayer dielectric layer 120, but may alternatively be formed through all or some of the metal interlayer dielectric layers 135, 150 and 165.

The optical light guides 170 are filled with dielectric, such as fluorine-doped silicate glass (FSG), having a refractive index higher than those of the metal interlayer dielectric layers 135, 150 and 165. As an example, the optical light guides 170 may be self-aligned with the uppermost level metal wires.

Referring to FIG. 2, a passivation layer 175 is formed on a portion of the dummy sensor region 30 and the peripheral circuit region 40. For example, the passivation layer 175 may be a layer including a silicone nitride (SiN) layer. A flattening layer 180 is formed on the passivation layer 175, the optical light guides 170 and the uppermost level metal wires 160. Thereafter, color filters 185a, 185b and 185c are formed on the flattening layer 180 within the main sensor region 20. The color filters may be three color filters, that is, a red filter 185b, a green filter 185c and a blue filter 185a, and are respectively formed on the photoelectric conversion elements 105. Thereafter, microlenses 190 are respectively formed on the color filters 185a, 185b and 185c.

Figure 3A:
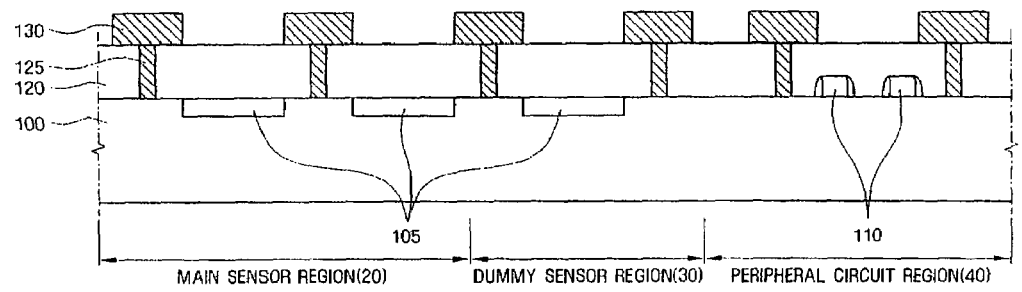
FIGS. 3A to 3F are sectional views illustrating a method of manufacturing an image sensor according to the present invention.

FIGS. 3A to 3F are sectional views illustrating a method of manufacturing the image sensor according to the present invention. Referring to FIG. 3A, a substrate 100 having a sensor region 10, including a main sensor region 20 and a dummy sensor region 30, and a peripheral circuit region 40 surrounding the sensor region 10, is prepared. Photoelectric conversion elements 105 are formed in the sensor region 10 of the substrate 100 in or on the substrate 100. The photoelectric conversion elements 105 are light-receiving elements which generate charge in proportion to the amount of incident external light. For example, the photoelectric conversion elements 105 may include N-type photodiodes and P-type photodiodes formed on the surface of the substrate 100. In this case, the N-type photodiode generates electrons in proportion to the amount of incident external light, and the P-type photodiode eliminates dark current that is generated due to defects present on the surface of the substrate 100. Furthermore, a device-insulating layer (not shown), a deep well (not shown), or a source/drain region (not shown) may be additionally formed on the substrate 100.

Thereafter, a gate pattern 110 is formed on the substrate 100. For example, the gate pattern 110 may be a gate pattern for NMOS or PMOS transistors within the peripheral circuit region 40, or a gate pattern for read-out elements (not shown) such as transfer gates, reset gates, selection gates or drive gates within the sensor region 10. Thereafter, an interlayer dielectric layer 120 is deposited on the gate pattern 110 and the substrate 100. First contacts 125 are then formed in the interlayer dielectric layer 120. In this case, the first contacts 125, which are made of metal, such as tungsten or cooper, function to electrically connect upper metal wires to the source/drain (not shown) or the gate pattern 110 of the silicon substrate. First level metal wires 130 are formed on the first contacts 125 and the interlayer dielectric layer 120. In this case, the first level metal wires 130 may be metal layers made of aluminum or copper. For example, the thickness of the first level metal wires 130 may be within a range of about 1500 to 3000 Å. Although, in the drawing of the present embodiment, the process of forming aluminum metal wires is illustrated, the process can be applied to copper wires formed using a dual damascene process.

Figure 3B:
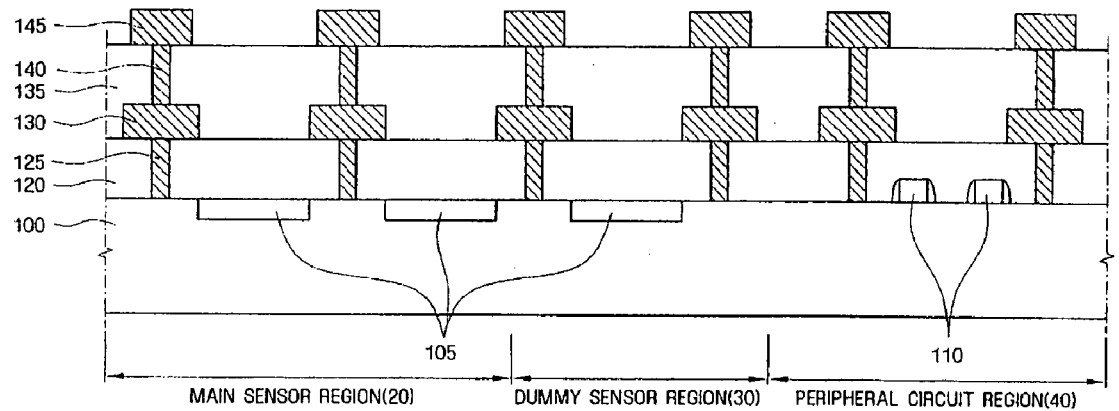

Referring to FIG. 3B, a first level metal interlayer dielectric layer 135 is formed. Thereafter, second contacts 140 are formed in the first level metal interlayer dielectric layer 135. The second contacts 140 are contacts that electrically connect upper metal wires to lower metal wires. Second level metal wires 145 are formed on the second contacts 140 and the first level metal interlayer dielectric layer 135. Such second metal wires 145 may be metal layers made of aluminum or copper. For example, the thickness of the second metal wires 145 may be within a range of about 1500 to 3000 Å. Although, in the drawing of the present embodiment, the process of forming aluminum metal wires is illustrated, it can be applied to copper wires formed using a dual damascene process.

Figure 3C:
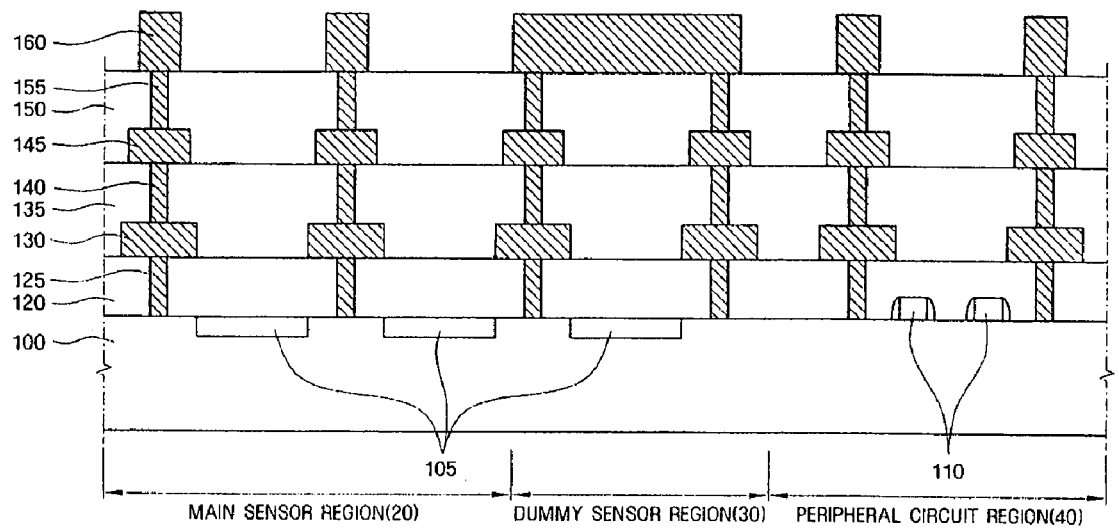

Referring to FIG. 3C, a second level metal interlayer dielectric layer 150 is formed on the second level metal wires 145 and the first level metal interlayer dielectric layer 150. Thereafter, third contacts 155 are formed in the second level metal interlayer dielectric layer 150. The third contacts 155 electrically connect upper metal wires to lower metal wires. Third level metal wires 160 are formed on the third contacts 155 and the second level metal interlayer dielectric layer 150. Such third level metal wires 160 may be metal layers made of aluminum or copper. In this embodiment, the process using aluminum metal wires is described. The thickness of the third metal wires 160 may be within a range of about 4000 to 6000 Å.

Although, in this embodiment, the uppermost level metal wires have been described as being third level wires, the uppermost level metal wires may be second level metal wires, or n-level (where n is an integer greater than 2) metal wires.

Figure 3D:
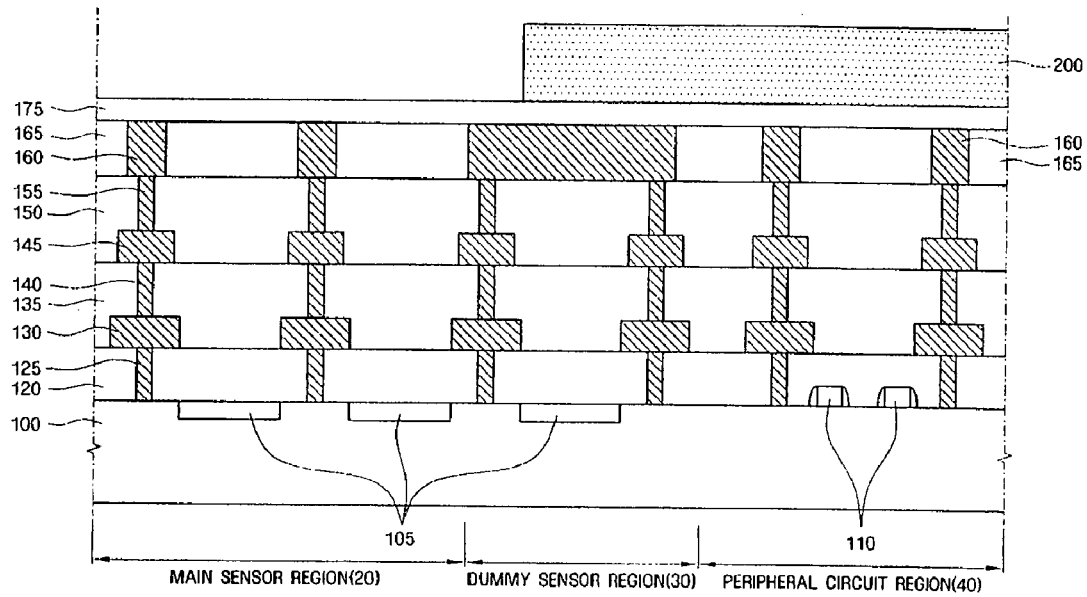

Referring to FIG. 3D, a third level metal interlayer dielectric layer 165, covering the third level metal wires 160, is formed and planarized to expose the third level metal wires 160. The third level metal interlayer dielectric layer 165 may have the same height as the third level metal wires 160, or may cover the third level metal wires 160. Thereafter, a passivation layer 175 is formed on the third level metal interlayer dielectric layer 165 or the third metal wires 160. For example, the passivation layer 175 may be a layer made of silicone nitride (SiN). Next, a first mask pattern 200 for exposing at least the main region 20 is formed. In this case, the first mask pattern 200 may be formed to additionally expose a portion of the dummy sensor region 30.

Figure 3E:
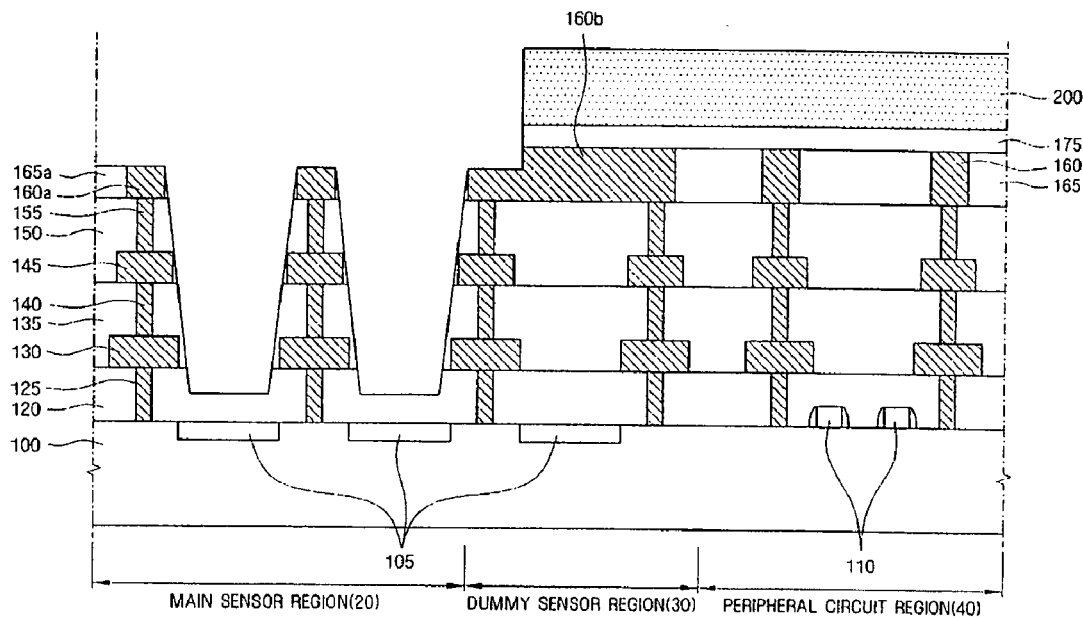

Referring to FIG. 3E, using the first mask pattern 200, the passivation layer 175, an upper portion of the uppermost level metal wires, for example, the third level metal wires 160, and an upper portion of the uppermost metal interlayer dielectric layer, for example, the third level metal interlayer dielectric layer 165, within the main sensor region 20, are sequentially removed through etching. In this etching process, fluorine gas may be used as the etching source gas. For example, when CF4 gas is used, the etching ratio of dielectric to metal wires may be within a range of about 3:1 to 5:1.

Furthermore, optical light guides 170, which are self-aligned using the third level metal wires 160 as a mask, are formed through further etching. The optical light guides 170 are formed to correspond with underlying photoelectric conversion elements 105 and may be spaced apart from the photoelectric conversion elements 105 in consideration of the number of metal wires or the optical characteristics of the image sensor. In this embodiment, the optical light guides 170 are formed entirely through the metal interlayer dielectric layers 135, 150 and 165 and partially through the interlayer dielectric layer 120, but may alternatively be formed through all of the metal interlayer dielectric layers 135, 150 and 165 or part of the interlayer dielectric layer 120.

In the image sensor formed as described above, the thickness of the sensor region, in particular, the thickness of the third level metal wires 160a within the main sensor region 20, is less than that of the peripheral circuit region, in particular, less than that of the third level metal wires 160 within the peripheral circuit region 40. Specifically, the thickness of the third level metal wires 160 within the peripheral circuit region 40 may be within a range of about 4000 to 6000 Å, and the thickness of the third level metal wires 160a within the sensor region 20 may be within a range of about 1500 to 3000 Å. In this case, the third level metal wires 160a and 160 may be made of metal or metal alloy, including aluminum. Although, in this embodiment, the image sensor has first to third level metal wires, the uppermost level metal wires may be the second level metal wires or n-level metal wires (where n is an integer greater than 2).

In this example, a portion of the third level metal wire 160b, which is the uppermost level metal wire, within the dummy sensor region 30 has the same thickness as the third level metal wire 160a within the main sensor region 20 and the remaining portion of the third level metal wire 160 has the same thickness as the third level metal wire 160 within the peripheral circuit region 40.

Figure 3F:
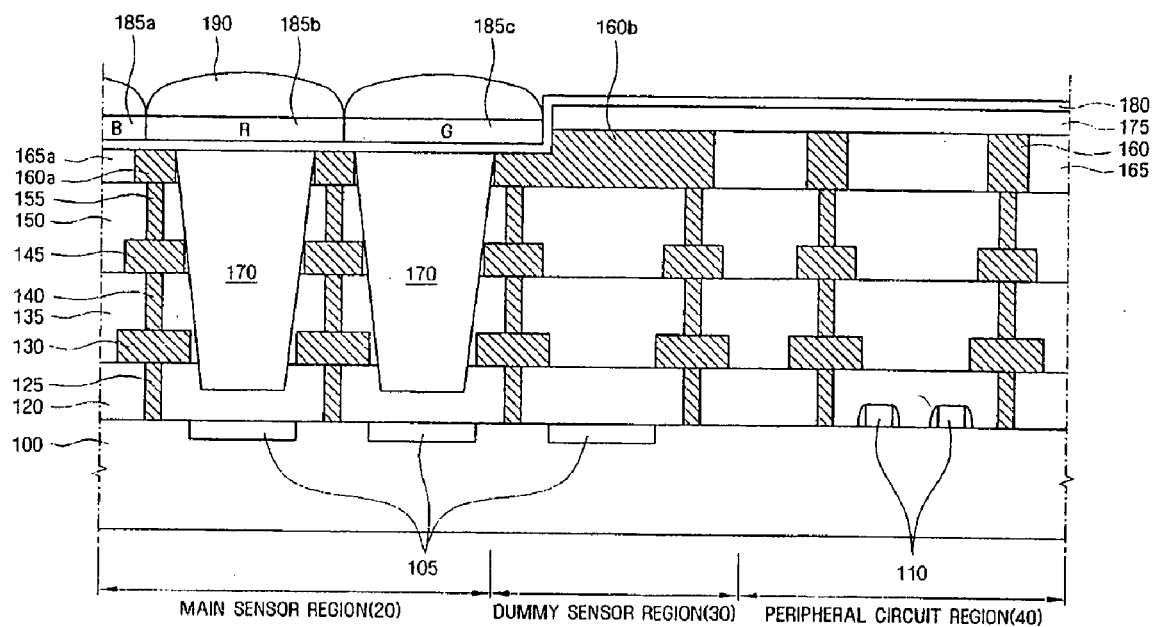

Referring to FIG. 3F, the optical light guides 170 are filled with dielectric material, such as FSG, having a refractive index higher than those of the metal interlayer dielectric layers 135, 150 and 165. A flattening layer 180 for the formation of subsequent color filters and micro lenses is formed. Thereafter, color filters 185a, 185b and 185c are formed on the flattening layer 180 within the main sensor region 20. Each of the photoelectric conversion elements 105 includes one of the color filters, that is, a red filter 185b, a green filter 185c and a blue filter 185a. Thereafter, microlenses 190 are respectively formed on the color filters 185a, 185b and 185c.

As described above, according to the embodiments of the present invention, an image sensor, in which the thickness of the n-level metal wires of the sensor region is less than that the thickness of the same level metal wires of the peripheral circuit region 40, thereby improving sensitivity, is provided, along with a method of manufacturing the same.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. An image sensor comprising:
   a substrate in which a sensor region and a peripheral circuit region are defined;
   a plurality of photoelectric conversion elements formed in or on the substrate within the sensor region;
   first to n-level (where n is an integer greater than or equal to 2) metal wires sequentially formed on the substrate; and
   first level to n-level metal interlayer dielectric layers respectively corresponding to the first level to n-level metal wires;
   wherein a thickness of the n-level metal wires within the sensor region is less than a thickness of the n-level metal wires within the peripheral circuit region; and
   wherein a thickness of the n-level metal interlayer dielectric layer within the sensor region is less than a thickness of the n-level metal interlayer dielectric layer within the peripheral circuit region.

2. The image sensor as set forth in claim 1, wherein the thickness of the n-level metal wires within the sensor region is within a range of about 1500 to 3000 Å, and the thickness of the n-level metal wires within the peripheral circuit-region is within a range of about 4000 to 6000 Å.

3. The image sensor as set forth in claim 1, wherein the n-level metal wires are second level metal wires.

4. The image sensor as set forth in claim 1, wherein the n-level metal wires are third level metal wires.

5. The image sensor as set forth in claim 1, wherein the n-level metal wires comprise metal or metal alloy including aluminum.

6. The image sensor as set forth in claim 1, wherein thicknesses of the first level to n–1-level metal wires within the sensor region are respectively equal to thicknesses of respective first level to n–1-level metal wires within the peripheral circuit region.

7. The image sensor as set forth in claim 1, further comprising a plurality of optical light guides positioned to correspond to the plurality of photoelectric conversion elements, the optical light guides being self-aligned with the n-level metal wires and being formed in the metal interlayer dielectric layer.

8. The image sensor as set forth in claim 7, further comprising:
 a plurality of color filters respectively formed on the photoelectric conversion elements; and
 a plurality of microlenses respectively formed on the color filters.

9. An image sensor comprising:
 a substrate in which a sensor region, including a main sensor region, a dummy sensor region, and a peripheral circuit region are defined;
 a plurality of photoelectric conversion elements formed in or on the substrate within the sensor region;
 a plurality of metal wires formed on the substrate; and
 a plurality of metal interlayer dielectric layers surrounding the plurality of metal wires;
 wherein the at least one of the metal wires within the main sensor region is thinner than a corresponding level metal wire within the peripheral circuit region; and
 wherein a thickness of a first portion of the metal wires in a part of the dummy sensor region is less than a thickness of a second portion of the metal wires in a remaining part of the dummy sensor region.

10. The image sensor as set forth in claim 9, wherein the metal wires within the main sensor region are the uppermost level wires.

11. The image sensor as set forth in claim 9, wherein uppermost level metal wires comprise metal or metal alloy including aluminum.

12. The image sensor as set forth in claim 9, wherein the first portion of the metal wires is adjacent the main sensor region.

* * * * *